(12) United States Patent
Tang et al.

(10) Patent No.: US 12,550,275 B2
(45) Date of Patent: Feb. 10, 2026

(54) COVER PLATE, DISPLAY MODULE, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Qiang Tang, Beijing (CN); Tiejun Bi, Beijing (CN); Yongxiao Gao, Beijing (CN); Shiyou Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 459 days.

(21) Appl. No.: 18/021,003

(22) PCT Filed: May 17, 2022

(86) PCT No.: PCT/CN2022/093292
§ 371 (c)(1),
(2) Date: Feb. 13, 2023

(87) PCT Pub. No.: WO2023/220921
PCT Pub. Date: Nov. 23, 2023

(65) Prior Publication Data
US 2025/0267812 A1    Aug. 21, 2025

(51) Int. Cl.
*H05K 5/03* (2006.01)
*B32B 3/02* (2006.01)
(Continued)

(52) U.S. Cl.
CPC ............ *H05K 5/03* (2013.01); *B32B 3/02* (2013.01); *B32B 17/06* (2013.01);
(Continued)

(58) Field of Classification Search
CPC .. H05K 5/03; B32B 3/02; B32B 17/06; B32B 2255/26; B32B 2255/28; B32B 2307/546;
(Continued)

(56) References Cited

U.S. PATENT DOCUMENTS 9,321,677 B2 * 4/2016 Chang ............... B32B 3/263
9,321,679 B2 * 4/2016 Chang ............... C03C 17/32
(Continued)

FOREIGN PATENT DOCUMENTS

CN    107452284 A  * 12/2017  ............ H05K 5/03
CN    110047393 A  *  7/2019  ............ G09F 9/301
(Continued)

*Primary Examiner* — Rockshana D Chowdhury
*Assistant Examiner* — Martin Antonio Asmat Uceda
(74) *Attorney, Agent, or Firm* — WHDA, LLP

(57) ABSTRACT

The present disclosure relates to a cover plate, including a cover plate body including a bending area and non-bending areas located at two sides of the bending area, where each of the non-bending areas includes a glass substrate and the bending area includes a first optical resin coating layer formed by a coating process using an optical resin material. The present disclosure also relates to a display module and a display device. The cover plate body includes at least two structures of the first optical resin coating layer and the glass substrate, where the first optical resin coating layer with a strong bending performance is provided in the bending area and the glass substrate with a strong impact strength is provided in the non-bending areas so as to solve a problem that impact strength and bending performance of the cover plate only made of the glass substrate cannot be balanced.

18 Claims, 7 Drawing Sheets

(51) Int. Cl.
*B32B 17/06* (2006.01)
*C03C 17/34* (2006.01)

(52) U.S. Cl.
CPC ...... *C03C 17/3405* (2013.01); *B32B 2255/26* (2013.01); *B32B 2255/28* (2013.01); *B32B 2307/546* (2013.01); *B32B 2307/558* (2013.01); *B32B 2457/20* (2013.01); *C03C 2217/29* (2013.01); *C03C 2217/78* (2013.01)

(58) Field of Classification Search
CPC .......... B32B 2307/558; B32B 2457/20; C03C 17/3405; C03C 2217/29; C03C 2217/78; G09F 9/301
See application file for complete search history.

(56) References Cited

U.S. PATENT DOCUMENTS

| | | | | |
|---|---|---|---|---|
| 9,947,882 | B2* | 4/2018 | Zhang | G06F 1/1616 |
| 10,003,044 | B2* | 6/2018 | Nam | H10K 59/871 |
| 10,014,352 | B1* | 7/2018 | Tsai | H10K 59/40 |
| 10,429,895 | B2* | 10/2019 | Lee | G06F 1/1643 |
| 10,845,848 | B2* | 11/2020 | Jones | G06F 1/1618 |
| 11,227,514 | B2* | 1/2022 | He | G09F 9/301 |
| 11,532,797 | B2* | 12/2022 | Paek | H10K 59/873 |
| 12,024,457 | B2* | 7/2024 | Wong | C03C 17/32 |
| 12,044,822 | B2* | 7/2024 | Park | G06F 1/1652 |
| 12,063,822 | B2* | 8/2024 | Ye | G06F 3/0412 |
| 12,207,489 | B2* | 1/2025 | Eo | H10K 59/873 |
| 12,222,761 | B2* | 2/2025 | Xu | H04M 1/0269 |
| 12,422,607 | B2* | 9/2025 | Gui | G02B 5/30 |
| 12,426,184 | B2* | 9/2025 | Chen | H05K 5/0017 |
| 2017/0092884 | A1* | 3/2017 | Zhang | H10K 59/879 |
| 2018/0090698 | A1* | 3/2018 | Jeong | H10K 59/873 |
| 2019/0051223 | A1 | 2/2019 | Li et al. | |
| 2020/0324521 | A1* | 10/2020 | Park | B24B 7/24 |
| 2021/0107826 | A1* | 4/2021 | Hwang | C03C 17/3405 |
| 2021/0107829 | A1* | 4/2021 | Chen | G06F 1/1626 |
| 2021/0119155 | A1* | 4/2021 | Huang | H10K 59/8731 |
| 2022/0007530 | A1* | 1/2022 | He | G06F 1/1652 |
| 2022/0048813 | A1* | 2/2022 | Kim | C03C 23/0025 |
| 2022/0217863 | A1* | 7/2022 | Kim | G06F 1/1656 |
| 2022/0287195 | A1* | 9/2022 | Chen | B32B 7/12 |
| 2023/0006006 | A1* | 1/2023 | Cho | G02B 1/14 |
| 2023/0278917 | A1* | 9/2023 | Ostholt | C03C 23/0025 428/156 |
| 2023/0296819 | A1* | 9/2023 | Gui | G02B 5/20 |
| 2023/0309368 | A1* | 9/2023 | Allan | H10K 77/111 |
| 2024/0023410 | A1* | 1/2024 | Xu | H10K 59/871 |

FOREIGN PATENT DOCUMENTS

| | | | | |
|---|---|---|---|---|
| CN | 110634404 A | | 12/2019 | |
| CN | 110807991 A | | 2/2020 | |
| CN | 111063258 A | * | 4/2020 | ............ G09F 9/301 |
| CN | 210896333 U | * | 6/2020 | |
| CN | 111724682 A | | 9/2020 | |
| CN | 114241899 A | | 3/2022 | |
| JP | 2019215542 A | | 12/2019 | |

* cited by examiner

COVER PLATE, DISPLAY MODULE, AND DISPLAY DEVICE

CROSS-REFERENCE TO RELATED APPLICATION

The present application is the U.S. national phase of PCT Application No. PCT/CN2022/093292 filed on May 17, 2022, the entire contents of which are hereby incorporated by reference.

TECHNICAL FIELD

The present disclosure relates to the technical field of display product manufacturing, and more particularly, relates to a cover plate, a display module, and a display device.

BACKGROUND

When a thickness of glass reaches below 100 um, flexibility of the glass is exhibited. At present, ultra-thin flexible glass has become a core component of a folding display cover plate. Compared with a polymer material, a glass material has a higher Young's modulus, and an ability of deformation recovery after bending is better than the polymer material. When applied in a folding screen, the glass material can significantly improve a crease problem of the folding display screen. However, in order to ensure good bending performance of the folding display screen, the thickness of the glass must be very thin. At present, the thickness of the ultra-thin glass that is widely used is basically 30-70 um. However, when the thickness of the glass reaches 70 μm or less, impact strength of the glass is extremely weak, i.e., the impact strength and bending performance of the glass cannot be taken into account at the same time.

Ultra-thin flexible glass is expensive compared with conventional rigid mobile phone cover plate glass, and the price of the ultra-thin flexible glass may be tens of times higher. How to use thicker glass to replace or partially replace ultra-thin flexible glass has become a hot research direction.

SUMMARY

In order to solve the above technical problem, a cover plate, a display module and a display device are provided by the present disclosure to solve the problem that the impact strength and bending performance of the cover plate only made of glass cannot be balanced.

In order to achieve the above object, the technical solution adopted in an embodiment of the present disclosure is: a cover plate, including a cover plate body including a bending area and non-bending areas located at two sides of the bending area, each of the non-bending areas comprises a glass substrate, and the bending area comprises a first optical resin coating layer formed by a coating process using an optical resin material.

In one embodiment, the cover plate body includes a first side and a second side oppositely arranged in a thickness direction thereof; in a direction from the first side to the second side, each of the non-bending areas includes the glass substrate and a second optical resin coating layer coated on the glass substrate;
the first optical resin coating layer includes a first surface located on the second side, the second optical resin coating layer includes a second surface located on the second side, and the first surface and the second surface are in the same plane.

In one embodiment, the glass substrate includes a third surface located on the first side, the first optical resin coating layer includes a fourth surface located on the first side, and the third surface and the fourth surface are in the same plane.

In one embodiment, the first side of the cover plate body is bonded with a first flexible film material through an optical adhesive layer, or the second side of the cover plate body is bonded with the first flexible film material through the optical adhesive layer.

In one embodiment, the first flexible film material is made of polyethylene terephthalate, PET, colorless polyimide, CPI, polymethyl methacrylate, PMMA, or ultra-thin glass.

In one embodiment, the thickness of the first flexible film material is less than or equal to 20 um.

In one embodiment, the cover plate body further includes a transition area between the bending area and each of the non-bending areas, the transition area includes a third optical resin coating layer, the third optical resin coating layer includes a fifth surface located on the second side, and the fifth surface and the second surface are in the same plane; and the glass substrate includes the third surface located on the first side, the third optical resin coating layer includes a sixth surface located on the first side, and the sixth surface and the third surface are in the same plane.

In one embodiment, in the direction from the first side to the second side, the bending area includes a second flexible film material and the first optical resin coating layer coated on the second flexible film material.

In one embodiment, the second flexible film material is made of PET, CPI, PMMA, or ultra-thin glass.

In one embodiment, a thickness of the second flexible film material is less than or equal to 70 um.

In one embodiment, the first side of the cover plate body is bonded with a third flexible film material through the optical adhesive layer, or the second side of the cover plate body is bonded with the third flexible film material through the optical adhesive layer.

In one embodiment, the third flexible film material is made of PET, CPI, PMMA, or ultra-thin glass.

In one embodiment, a thickness of the glass substrate is greater than or equal to 300 um.

In one embodiment, the glass substrate includes a side surface arranged close to the bending area and a light incident surface, and a light emitting surface adjacent to the side surface, the light incident surface is configured for receiving the light emitted by a display panel;

an edge where the light emitting surface meets the side surface is chamfered or rounded; and/or an edge where the light incident surface meets the side surface is chamfered or rounded.

In one embodiment, a cross section of one end of the glass substrate close to the bending area in the thickness direction of the cover plate body is ½ ellipse, or the cross section of the end of the glass substrate close to the bending area in the thickness direction of the cover plate body is ¼ ellipse, and the ¼ ellipse protrudes toward a direction away from the light incident surface.

In one embodiment, in a direction from each of the non-bending areas to the bending area, the light emitting surface of the glass substrate includes a plane portion, a slope portion, and an arc portion, and the arc portion is formed by rounding at an intersection of the light emitting surface and the side surface; and/or in the direction from each of the non-bending areas to the bending area, the light incident surface of the glass substrate includes a plane portion, a slope portion, and an arc portion, and the arc portion is formed by rounding at an intersection of the light incident surface and the side surface.

In one embodiment, the first optical resin coating layer, the second optical resin coating layer, and the third optical resin coating layer are made of the same material, and a difference between a refractive index of the first optical resin coating layer and a refractive index of the glass substrate is less than or equal to 0.01.

In one embodiment, the refractive index of the first optical resin coating layer is n, and $1.50 \leq n \leq 1.54$.

In one embodiment, transmittance of the first optical resin coating layer is more than or equal to 90%.

In one embodiment, the material of the first optical resin coating layer is one or more of polyester, polyurethane, thermoplastic polyurethane, polyamide, polyimide, polymethyl methacrylate, polypropylene, polyethylene, polypropylene, polyvinyl chloride, polystyrene, styrene, polyoxymethylene, polyphenylene oxide, polyphenylene sulfide, polysulfone, polyaryletherketone, styrene, polyolefin and polyolefin.

A display module is further provided in an embodiment of the present disclosure, including a display panel and the cover plate located on a light-emitting side of the display panel.

In one embodiment, the display panel includes a binding area, the binding area is bent to a backlight side of the display panel to be in a binding connection with a main circuit board, and a protective adhesive layer is provided on one side of the binding area close to the cover plate; and an orthographic projection of the binding area on the cover plate is coincided completely with the cover plate, or the orthographic projection of the binding area on the cover plate is located in a first region of the cover plate, and the cover plate includes an edge region exposed at periphery of the first region.

In one embodiment, the cover plate includes the edge region exposed at the periphery of the first region, and a center frame of the display module is connected to a side of the edge region close to the display panel.

A display device is further provided in an embodiment of the present disclosure, including the display module.

Technical effects of the present disclosure are: the cover plate body includes at least two structures of the first optical resin coating layer and the glass substrate, the first optical resin coating layer with a strong bending performance is provided in the bending area and the glass substrate with a strong impact strength is provided in the non-bending areas so as to solve the problem that the impact strength and the bending performance of the cover plate only made of glass cannot be balanced.

DETAILED DESCRIPTION

Figure 1:
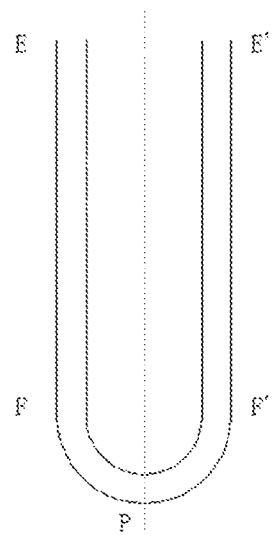
FIG. 1 is a schematic diagram 1 of a folding state of a cover plate according to an embodiment of the present disclosure.

In order to make the purposes, technical solutions, and advantages of the embodiments of the present disclosure clearer, the technical solutions of the embodiments of the present disclosure will be clearly and completely described below in conjunction with the drawings. Apparently, the described embodiments are some, but not all, of the disclosed embodiments. Based on the embodiments of the present disclosure described, all other embodiments available to those skilled in the art are within the scope of the present disclosure.

In describing the present disclosure, it should be noted that orientations or positional relationships indicated by the terms "central", "upper", "lower", "left", "right", "vertical", "horizontal", "inner", "outer" and the like are based on the orientations or positional relationships shown in the figures, merely to facilitate description of the present disclosure and simplify the description, and do not indicate or imply that the referenced devices or elements must have a particular orientation, be constructed and operated in a particular orientation, and thus should not be construed as limiting the present disclosure. Furthermore, the terms "first", "second", and "third" are used for descriptive purposes only and should not to be construed as indicating or implying relative importance.

Referring to FIG. 1-FIG. 15, a cover plate is provide in an embodiment of the present disclosure, including a cover plate body including a bending area 10 and non-bending areas 20 located at two sides of the bending area 10, each of the non-bending areas 20 includes a glass substrate 1 and the bending area 10 includes a first optical resin coating layer 2 formed by a coating process using an optical resin material.

In the related art, the thickness of the glass must be very thin in order to ensure the good bending performance of the folding display panel, and the thickness of the ultra-thin glass that is widely used in the related art is basically 30-70 um. However, when the thickness of the glass reaches 70 μm or less, the impact strength of the glass is extremely weak, i.e., the impact strength and bending performance of the glass cannot be taken into account at the same time. In the present embodiment, the cover plate body combines the first resin coating layer and the glass substrate 1, the first optical resin coating layer 2 with a strong bending performance is provided in the bending area 10, and the glass substrate 1 with a strong impact resistance is provided in each of the non-bending areas 20. Since the glass substrate 1 is only provided in the non-bending areas 20 and the non-bending areas do not need to be bent, a thickness of the glass substrate 1 can be set according to the requirements of impact strength without using ultra-thin glass. For example, the thickness of the glass substrate 1 can be more than or equal to 300 um, i.e., by combining the two structures of providing the first optical resin coating layer 2 in the bending area 10 and providing the glass substrate 1 in the non-bending areas 20, both good bending performance and good impact strength of the cover plate can be ensured.

Figure 2:
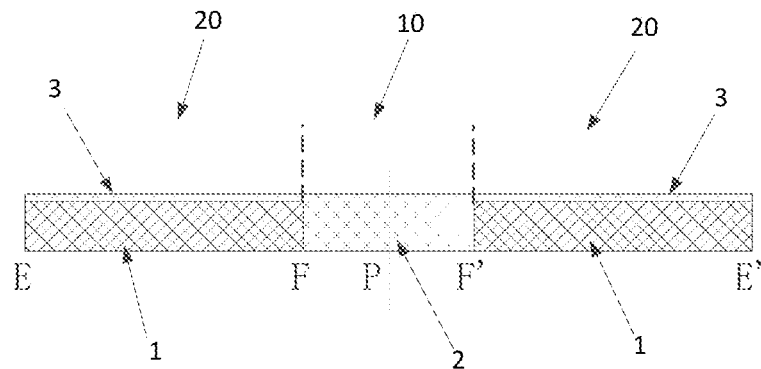
FIG. 2 is a schematic diagram 1 of a flattening state of the cover plate according to an embodiment of the present disclosure.

With reference to FIG. 1 and FIG. 2, FIG. 1 is a schematic diagram of a folding state of a cover plate and FIG. 2 is a schematic diagram of a flattening state of the cover plate. The cover plate in FIG. 1 is in a U-shaped structure in the folding state, an EF section and an F'E' section are the non-bending areas 20, and an FP-PF' section is the bending area 10. Since the EF and F'E' sections do not need to be bent, the glass substrate 1 can be used (the glass substrate 1 here can be conventional glass instead of ultra-thin glass), and the impact strength of the non-bending areas 20 can be greatly improved, and the FP-PF' section can be filled with the first optical resin coating layer 2 formed after optical resin coating and curing to ensure the bending performance.

Illustratively, in order to ensure the impact strength of the cover plate, the thickness of the glass substrate 1 is more than or equal to 300 um but is not limited thereto.

The first optical resin coating layer 2 is formed by curing after being coated by a coating process and has a strong bending performance. The material of the first optical resin coating layer 2 may be one or more of polyester, polyurethane, thermoplastic polyurethane, polyamide, polyimide, polymethyl methacrylate, polypropylene, polyethylene, polypropylene, polyvinyl chloride, polystyrene, styrene, polyoxymethylene, polyphenylene oxide, polyphenylene sulfide, polysulfone, polyaryletherketone, styrene, polyolefin and polyolefin.

Illustratively, the bending area 10 may be completely filled with the first optical resin coating layer 2, with reference to FIG. 2, but is not limited thereto. For example, in some embodiments, in order to enhance the impact strength of the bending area 10, a flexible film material may be added to the bending area 10 (the flexible film material is embedded in the first optical resin coating layer 2), but a thickness of the flexible film material needs to be small to ensure the bending performance of the bending area 10. For example, the thickness of the flexible film material may be less than 70 um but is not limited thereto.

Illustratively, the cover plate body includes a first side and a second side oppositely arranged in a thickness direction thereof. In a direction from the first side to the second side, each of the non-bending areas 20 includes the glass substrate 1 and a second optical resin coating layer 3 coated on the glass substrate 1.

Figure 3:
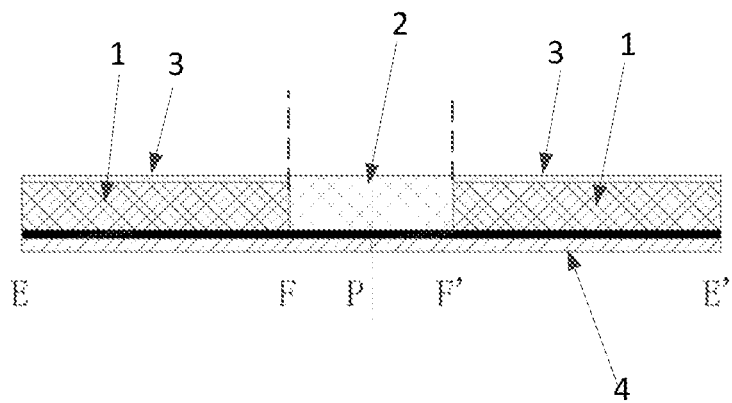
FIG. 3 is a schematic diagram 2 of the flattening state of the cover plate according to an embodiment of the present disclosure.
Figure 4:
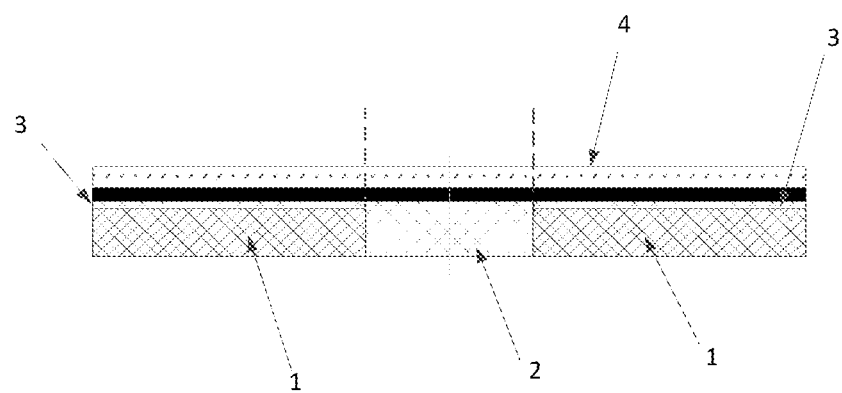
FIG. 4 is a schematic diagram 3 of the flattening state of the cover plate according to an embodiment of the present disclosure.

The first optical resin coating layer 2 includes a first surface located on the second side, the second optical resin coating layer 3 includes a second surface located on the second side, and the first surface and the second surface are in the same plane, with reference to FIG. 2-FIG. 4.

The second optical resin coating layer 3 is provided to compensate for a step difference between the glass substrate 1 and the first optical resin coating layer 2 and ensure flatness of the second side of the cover plate body.

Illustratively, the first optical resin coating layer 2 and the second optical resin coating layer 3 are of a unitary structure, and the first optical resin coating layer 2 and the second optical resin coating layer 3 are formed by a simultaneous process.

Illustratively, in order to ensure that there is no trace of an interface between the glass substrate 1 and the first optical resin coating layer 2 or the second optical resin coating layer 3, the first optical resin coating layer 2 and the second optical resin coating layer 3 are made of the same material, and a difference between a refractive index of the first optical resin coating layer 2 and a refractive index of the glass substrate 1 is less than or equal to 0.01. For example, the refractive index of the first optical resin coating layer 2 is n, and $1.50 \leq n \leq 1.54$, but is not limited thereto.

Illustratively, the glass substrate 1 includes a third surface located on the first side, and the first optical resin coating layer 2 includes a fourth surface located on the first side, the third surface and the fourth surface are in the same plane.

Illustratively, the first side of the cover plate body is bonded with a first flexible film material 4 through an optical adhesive layer, and/or the second side of the cover plate body is bonded with the first flexible film material 4 through the optical adhesive layer, with reference to FIG. 3 and FIG. 4.

Illustratively, the first flexible film material 4 may be made of an organic material such as PET, CPI, PMMA, or an ultra-thin glass. The first flexible film material 4 can have impact strength, scratch resistance, bending resistance, and surface hardness.

Illustratively, a thickness of the first flexible film material 4 is 50-80 um.

An example of providing the first flexible film material on the first side is shown in FIG. 3 and an example of providing the first flexible film material on the second side is shown in FIG. 4. It should be noted that the first flexible film material is arranged on one side of the cover plate body for connecting with the display panel, then the arrangement of the first flexible film material can play a protective role on the display panel and enhance the impact strength of the whole display panel; the first flexible film material is arranged on one side of the cover plate body opposite to the side connected with the display panel, i.e., the first flexible film material is arranged on one side of the cover plate body away from the display panel, then the first flexible film material plays a protective role on both the cover plate body and the display panel and improves the impact strength of the display module. The first flexible film material can serve as a human-computer interaction surface to enhance friction resistance.

It should be noted that since the ultra-thin glass is fragile, in some embodiments, when the first flexible film material is provided on the side of the cover plate body away from the display panel, the first flexible film material is made of an organic material such as PET, CPI, and PMMA.

Referring to FIG. 5-FIG. 10, illustratively, the cover plate body further includes a transition area 30 between the bending area 10 and each of the non-bending areas 20, the transition area 30 includes a third optical resin coating layer 6, the third optical resin coating layer 6 includes a fifth surface located on the second side, and the fifth surface and the second surface are in the same plane.

The glass substrate 1 includes the third surface located on the first side, the third optical resin coating layer 6 includes a sixth surface located on the first side, and the sixth surface and the third surface are in the same plane.

With regard to the cover plate in a water drop shape in a folding state, the transition area 30 is subjected to the maximum tensile stress, and cracks are easily generated during bending. In this regard, in the present embodiment, the third optical resin coating layer 6 is provided in the transition area 30, and the transition area 30 is completely filled with the third optical resin coating layer 6 so as to ensure the bending performance of the transition area 30 and avoid the cracks generated during bending.

Illustratively, in the direction from the first side to the second side, the bending area 10 includes a second flexible film material 7 and the first optical resin coating layer 2 coated on the second flexible film material 7.

The bending area 10 is subjected to the maximum compressive stress, and the combination of the first optical resin coating layer 2 and the second flexible film material 7 can increase the compressive resistance of the bending area 10 and ensure the bending performance thereof.

Illustratively, the second flexible film material 7 may be made of an organic material such as PET, CPI, PMMA, or ultra-thin glass. The second flexible film material 7 can have impact strength, scratch resistance, bending resistance, and surface hardness.

The first side or the second side of the cover plate body is configured for connecting with the display panel. It should be noted that when the first side of the cover plate body is configured for connecting with the display panel, since the ultra-thin glass is fragile, in some embodiments, the second flexible film material is made of an organic material such as PET, CPI, or PMMA.

For example, the first side of the cover plate body is bonded with a third flexible film material 8 through an optical adhesive layer; and/or the second side of the cover plate body is bonded with the third flexible film material 8 through the optical adhesive layer.

Illustratively, the third flexible film material 8 may be made of an organic material such as PET, CPI, PMMA, or ultra-thin glass. The third flexible film material 8 can have impact strength, scratch resistance, bending resistance, and surface hardness.

Illustratively, a thickness of the third flexible film material 8 is 50-80 um.

It should be noted that the third flexible film material is arranged on one side of the cover plate body for connecting with the display panel, then the arrangement of the third flexible film material 8 can play a protective role on the display panel and enhance the impact strength of the whole display panel; the third flexible film material 8 is arranged on one side of the cover plate body opposite to the side connected with the display panel, i.e., the third flexible film material 8 is arranged on one side of the cover plate body away from the display panel, then the third flexible film material 8 plays a protective role on both the cover plate body and the display panel and improves the impact strength of the display module. The third flexible film material 8 can serve as the human-computer interaction surface to enhance the friction resistance.

It should be stated that since the ultra-thin glass is fragile, in some embodiments, when the third flexible film material 8 is provided on the side of the cover plate body away from the display panel, the third flexible film material 8 is made of an organic material such as PET, CPI, or PMMA.

In some embodiments, the first side of the cover plate body is configured for connecting with the display panel, the second side is provided with the third flexible film material 8, and due to the arrangement of the third flexible film material 8, the second flexible film material 7 can be made of the ultra-thin glass, and the third flexible film material 8 plays a protective role.

Figure 7:
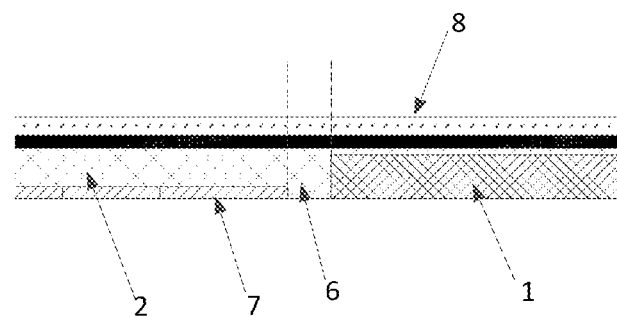
FIG. 7 is a schematic diagram 5 of the flattening state of the cover plate according to an embodiment of the present disclosure.
Figure 8:
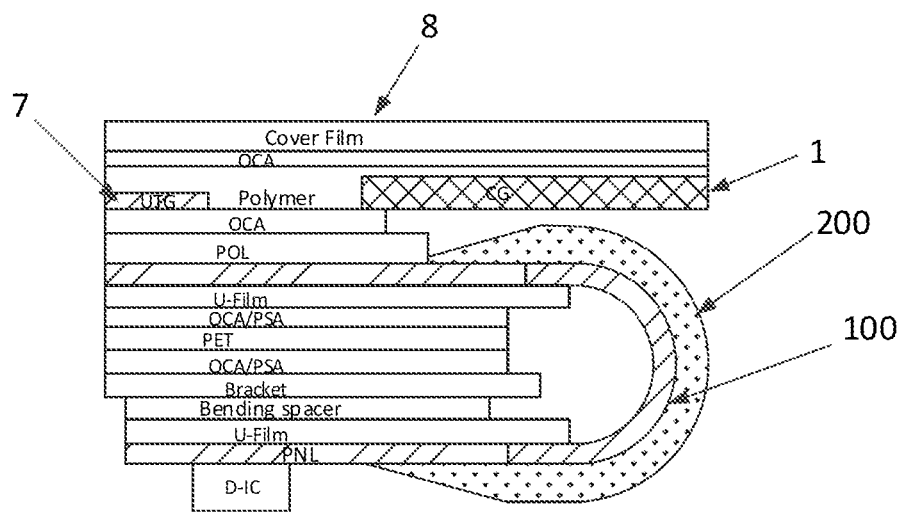
FIG. 8 is a schematic structural diagram 1 of a display module according to an embodiment of the present disclosure.
Figure 9:
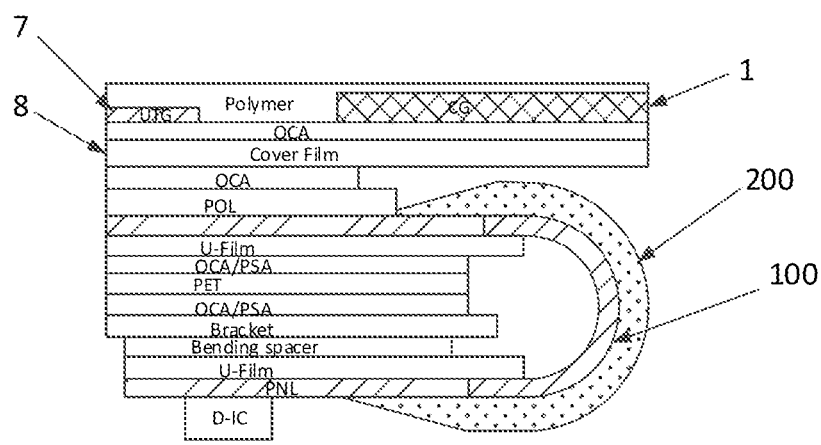
FIG. 9 is a schematic structural diagram 2 of the display module according to an embodiment of the present disclosure.

Referring to FIG. 7-FIG. 9, the first side of the cover plate body shown in FIG. 7 and FIG. 8 is configured for connecting with the display panel, and the second side is bonded with the third flexible film material 8 through the optical adhesive layer. Comparing FIG. 7 with FIG. 8, the structure shown in FIG. 7 has a strong impact strength and a strong friction resistance, the structure shown in FIG. 8 has a large hardness in the non-bending areas, and the structure shown in FIG. 10 makes the thickness of the entire display module thin.

Figure 5:
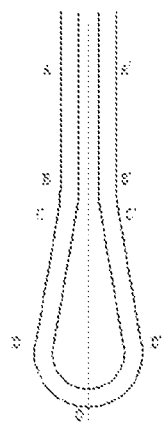
FIG. 5 is a schematic diagram 2 of the folding state of the cover plate according to an embodiment of the present disclosure.
Figure 6:
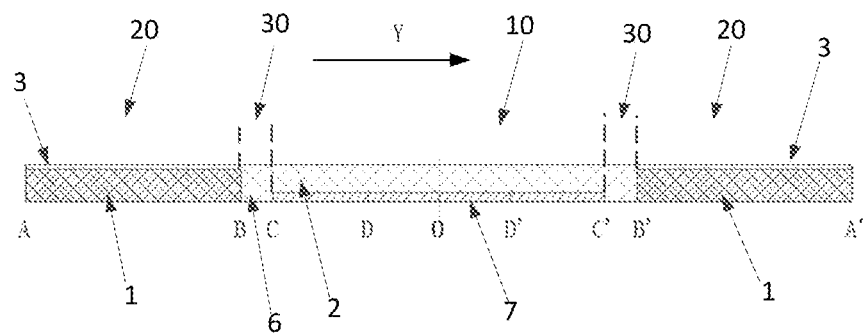
FIG. 6 is a schematic diagram 4 of the flattening state of the cover plate according to an embodiment of the present disclosure.

Referring to FIG. 5, a bending starting area (i.e., the transition area 30) is subjected to the greatest tensile stress, i.e., the greatest risk of peeling during bending. At the same time, where bending curvature is smallest (i.e., the bending area 10) is subjected to the largest compressive stress. The transition area 30, i.e., a BC section and a C'B' section shown in FIG. 6, is completely filled by the third optical resin coating layer 6 in view of a risk of peeling of the transition area 30 (i.e., the transition area 30 only includes the third optical resin coating layer 6, with reference to FIG. 6 and FIG. 7). Considering that positions where the compressive stress is maximum during bending (i.e., the bending area 10) are CO and OC' sections, and in combination with basic knowledge of inorganic materials, the compressive stress strength of the glass material is 10 times that of the tensile stress strength, the CO and OC' sections are filled with a bendable second flexible film material 7, i.e., the bending area 10 uses a method of combining the first optical resin coating layer 2 and the second flexible film material 7 (the thickness of the second flexible film material 7 can be less than or equal to 70 um but is not limited thereto). Considering that the non-bending areas 20, i.e., AB and B'A' sections, are not affected by a bending radius and bending times during the bending, a conventional cover plate glass with a thicker thickness is selected (i.e., the glass substrate 1, the thickness of the glass substrate 1 can be more than or equal to 300 um, but is not limited thereto). With the above solution, both the high impact strength of the non-bending areas 20 and the bending strength of the bending area 10 can be satisfied, and the risk of peeling caused by excessive tensile stress when bending the transition area 30 is circumvented by the provision of the third optical resin coating layer 6.

Figure 18:
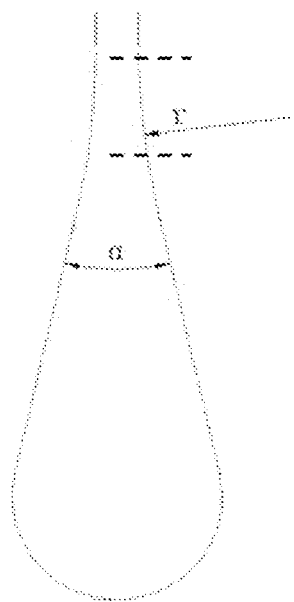
FIG. 18 is a schematic diagram of a state in which the cover plate is bent into a drop shape according to an embodiment of the present disclosure.

With reference to FIG. 18, it should be noted that a point at which the tensile stress is greatest when bending is located in an arc initiation area of the water drop (with reference to the region between two broken lines in FIG. 18), and an arc length of the arc initiation area is $$L: L = \frac{\pi r}{180°} * \frac{\alpha}{2};$$

where α is a water drop angle at which the cover plate is bent into a water drop shape; R is a water drop arc radius, with reference to FIG. 18.

It should be noted that the minimum value of the BC section (i.e., the transition area) in Y direction in FIG. 6 is L (i.e., the minimum value of the transition area in the Y direction, and the Y direction is perpendicular to the direction from the bending area to each of the non-bending areas). The length a of the BC section is more than or equal to L. When a width of the BC section in the Y direction is more than or equal to the arc length of the arc initiation area of the water drop, the optical resin coating layer (i.e., the third optical resin coating layer) is used in the region corresponding to the whole arc initiation area so as to avoid the risk of peeling caused by excessive local tensile stress at this part when bending.

Illustratively, the third optical resin coating layer 6 and the first optical resin coating layer 2 may be integrally formed by a simultaneous process, and the second optical resin coating layer 3, the first optical resin coating layer 2, and the third optical resin coating layer 6 may be integrally formed by the simultaneous process, ensuring the flatness of the second side of the cover plate, so that the cover plate forms a flexible cover plate in a complete water-drop shape when in the folding state.

Illustratively, the second side of the cover plate body is configured for connecting with the display panel, and the second flexible film material 7 is made of the ultra-thin glass.

The first side of the cover plate body is arranged away from the display panel, and the second flexible film material 7 is made of the ultra-thin glass, which can enhance the impact strength of the bending area 10 while ensuring the bending performance of the bending area 10.

Illustratively, the thickness of the second flexible film material 7 is less than or equal to 70 um.

With reference to FIG. 11-FIG. 15, illustratively, the glass substrate 1 includes a side surface 103 arranged close to the bending area 10, and a light incident surface 102 and a light emitting surface 101 adjacent to the side surface 103, the light incident surface 102 is configured for receiving the light emitted by a display panel.

An edge where the light emitting surface 101 meets the side surface 103 is chamfered or rounded and/or an edge where the light incident surface 102 meets the side surface 103 is chamfered or rounded.

Compared with a right-angle arrangement, chamfered or rounded arrangements can prevent unspecified lighting.

Figure 11:
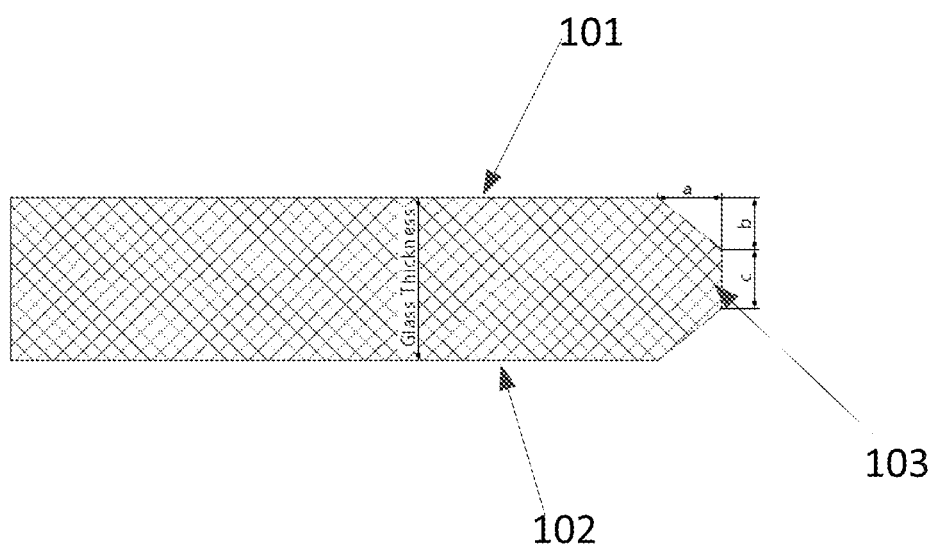
FIG. 11 is a schematic structural diagram 1 of a glass substrate according to an embodiment of the present disclosure.

In FIG. 11, the edge where the light emitting surface 101 meets the side surface 103 is chamfered, and the edge where the light incident surface 102 meets the side surface 103 is chamfered. Where, $1\ t \leq a \leq 1.9\ t$, $0.22\ t \leq b \leq 0.42\ t$, and $0.16\ t \leq c \leq 0.56\ t$.

Figure 14:
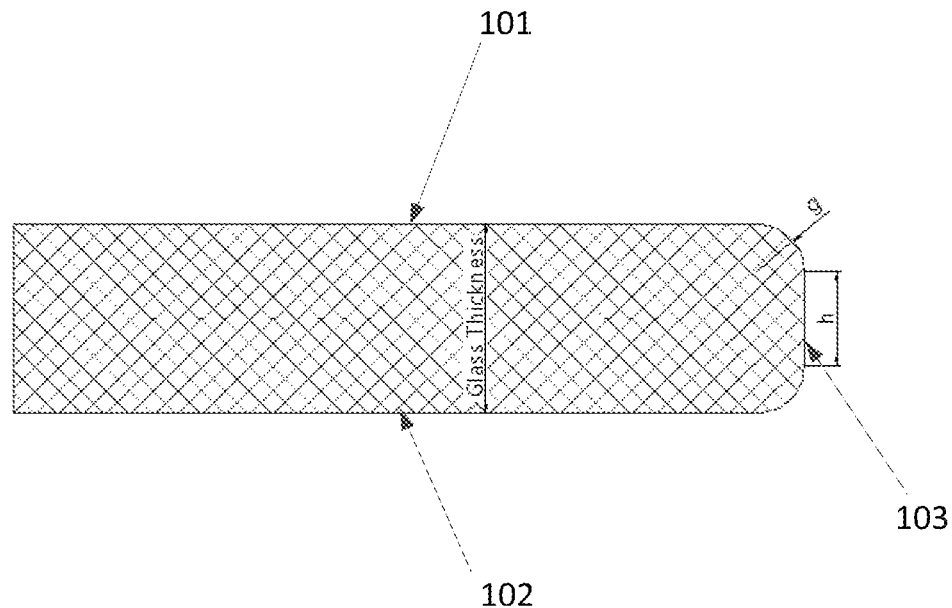
FIG. 14 is a schematic structural diagram 4 of the glass substrate according to an embodiment of the present disclosure.

In FIG. 14, the edge where the light emitting surface 101 meets the side surface 103 is rounded, and the edge where the light incident surface 102 meets the side surface 103 is rounded. Where, $0.1\ t \leq g < t$, and $0.1\ t \leq h \leq 0.8\ t$.

Illustratively, a cross section of one end of the glass substrate 1 close to the bending area 10 in the thickness direction of the cover plate body is ½ ellipse, or the cross section of one end of the glass substrate 1 close to the bending area 10 in the thickness direction of the cover plate body is ¼ ellipse, and the ¼ ellipse protrudes towards a direction away from the light incident surface 102.

Figure 12:
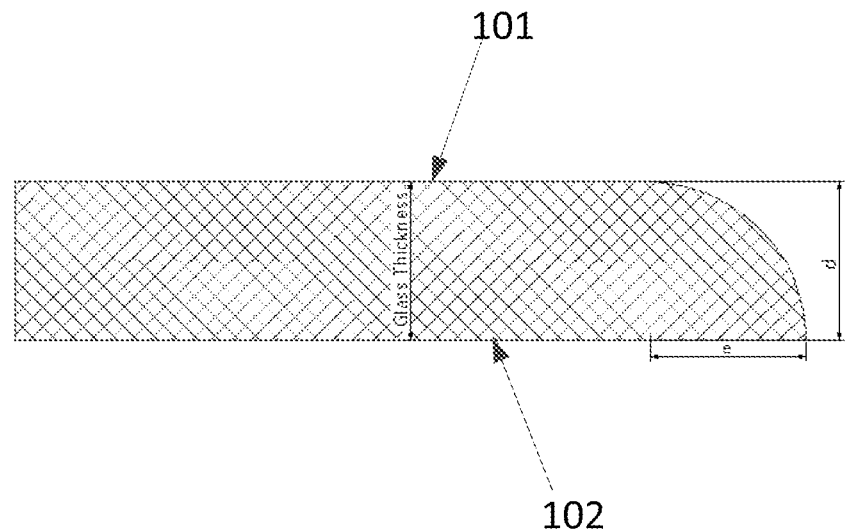
FIG. 12 is a schematic structural diagram 2 of the glass substrate according to an embodiment of the present disclosure.

In FIG. 12, the cross section of one end of the glass substrate 1 close to the bending area 10 in the thickness direction of the cover plate body is ¼ ellipse, where a semi-major axis of the ¼ ellipse is d, a semi-minor axis of the ¼ ellipse is e, $0.5\ t \leq d \leq 1.5\ t$, and $0.5\ t \leq e \leq 1.5\ t$.

Figure 13:
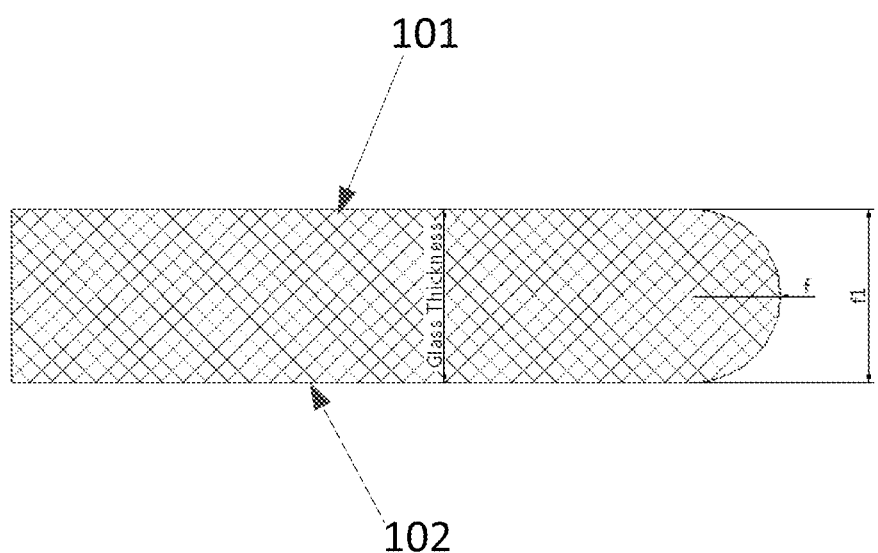
FIG. 13 is a schematic structural diagram 3 of the glass substrate according to an embodiment of the present disclosure.

In FIG. 13, the cross section of one end of the glass substrate 1 close to the bending area 10 in the thickness direction of the cover plate body is ½ ellipse, where the semi-major axis of the ½ ellipse is f, the semi-minor axis of the ½ ellipse is f1, $0.5\ t \leq f \leq 4\ t$, and f1=t.

Figure 15:
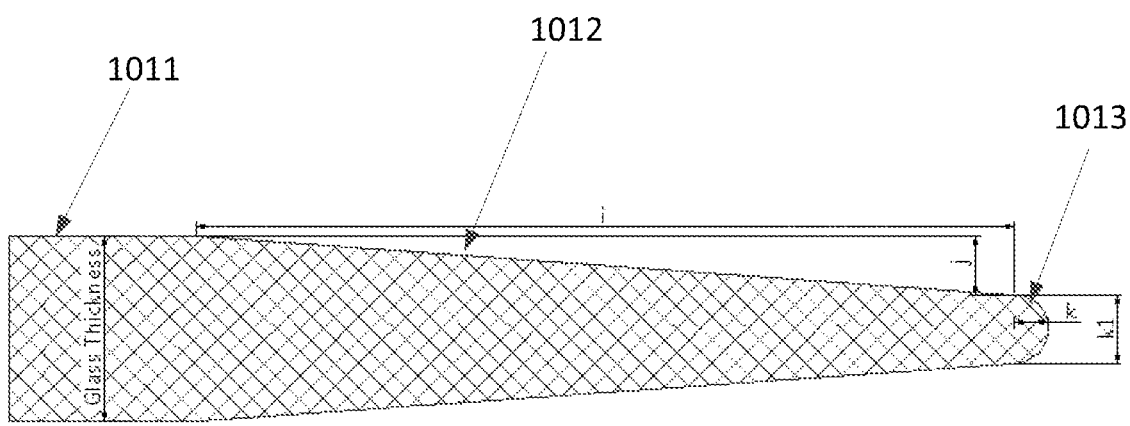
FIG. 15 is a schematic structural diagram 5 of the glass substrate according to an embodiment of the present disclosure.

Referring to FIG. 15, illustratively, in the direction from each of the non-bending areas 20 to the bending area 10, the light emitting surface 101 of the glass substrate 1 includes a plane portion 1011, a slope portion 1012, and an arc portion 1013, and the arc portion 1013 is formed by rounding at an intersection of the light emitting surface 101 and the side surface 103; and/or in the direction from each of the non-bending areas 20 to the bending area 10, the light incident surface 102 of the glass substrate 1 includes the plane portion, the slope portion, and the arc portion, and the arc portion is formed by rounding at the intersection of the light incident surface 102 and the side surface 103.

Illustratively, the light emitting surface 101 and the light incident surface 102 of the glass substrate 1 are arranged symmetrically.

Illustratively, the first optical resin coating layer 2, the second optical resin coating layer 3, and the third optical resin coating layer 6 are made of the same material, and the difference between the refractive index of the first optical resin coating layer 2 and the refractive index of the glass substrate 1 is less than or equal to 0.01 so as to avoid interface traces at an interface of any two adjacent structures in the glass substrate 1, the first optical resin coating layer 2, the second optical resin coating layer 3, and the third optical resin coating layer 6.

Illustratively, the refractive index of the first optical resin coating layer 2 is n, and $1.50 \leq n \leq 1.54$, but is not limited thereto.

Illustratively, the first optical resin coating layer 2 has a transmittance of more than or equal to 90%.

Illustratively, the material of the first optical resin coating layer 2 is one or more of polyester, polyurethane, thermoplastic polyurethane, polyamide, polyimide, polymethyl methacrylate, polypropylene, polyethylene, polypropylene, polyvinyl chloride, polystyrene, styrene, polyoxymethylene, polyphenylene oxide, polyphenylene sulfide, polysulfone, polyaryletherketone, styrene, polyolefin and polyolefin.

Taking the structure of the cover plate shown in FIG. 3 as an example, samples with different parameters are selected to perform a comparative test with the cover plate made of only ultra-thin glass in the related art.

A first sample: the thickness of the glass substrate 1 is 100 μm, the edge of the glass substrate 1 is a chamfer structure in FIG. 11, the first flexible film material 4 is made of an ultra-thin glass (UTG) with a thickness of 30 μm, the first flexible film material 4 is connected to the glass substrate 1 through an optical adhesive (OCA) with a thickness of 50 μm, the first optical resin coating layer 2 is composed of polyurethane, dimethylformamide, butyl acetate, a styryl trimethoxy silane coupling agent, an anti-foaming agent, and a leveling agent, a mass ratio of the compositions is 60:130:30:10:1:1, and the refractive index of the first optical resin coating layer is 1.513.

A second sample: the thickness of the glass substrate 1 is 200 μm, the edge of the glass substrate 1 is the chamfer structure in FIG. 11, the first flexible film material 4 is made of the UTG with a thickness of 30 μm, the first flexible film material 4 is connected to the glass substrate 1 through the OCA with the thickness of 50 μm, the first optical resin coating layer 2 is composed of polyurethane, dimethylformamide, butyl acetate, the styryl trimethoxy silane coupling agent, the defoaming agent, and the leveling agent, the mass ratio of the compositions is 60:130:30:10:1:1, and the refractive index of the first optical resin coating layer is 1.513.

A third sample: the thickness of the glass substrate 1 is 100 μm, the edge of the glass substrate 1 is the chamfer structure in FIG. 11, the first flexible film material 4 is made of an UTG with a thickness of 50 μm, the first flexible film material 4 is connected to the glass substrate 1 through the OCA with the thickness of 50 μm, the first optical resin coating layer 2 is composed of polyurethane, dimethylformamide, butyl acetate, the styryl trimethoxy silane coupling agent, the defoaming agent, and the leveling agent, the mass ratio of the compositions is 60:130:30:10:1:1, and the refractive index of the first optical resin coating layer is 1.513.

A fourth sample: the thickness of the glass substrate 1 is 100 μm, the edge of the glass substrate 1 is the chamfer structure in FIG. 11, the first flexible film material 4 is made of PET with a thickness of 50 μm, the first flexible film material 4 is connected to the glass substrate 1 through the OCA with the thickness of 50 μm, the first optical resin coating layer 2 is composed of polyurethane, dimethylformamide, butyl acetate, the styryl trimethoxy silane coupling agent, the defoaming agent, and the leveling agent, the mass ratio of the compositions is 60:130:30:10:1:1, and the refractive index of the first optical resin coating layer is 1.513.

Comparative sample 1 in the related art: only the UTG with the thickness of 30 um is used for manufacturing the cover plate.

Comparative sample 2 in the related art: only an UTG with a thickness of 70 um is used for manufacturing the cover plate.

It should be noted that test surfaces of the first sample and the second sample are both surfaces on which the first flexible film material 4 is not provided, and test surfaces of the third sample and the fourth sample are both surfaces of the first flexible film material 4 away from the glass substrate 1. And when the first sample, the second sample, the third sample, and the fourth sample are subjected to an impact test, no other film layer adheres to the outer surfaces (i.e., the test surfaces).

It should be noted that each of the first sample to the fourth sample includes the cover plate and the display panel assembled together. In each of the first sample to the fourth sample, the first optical resin coating layer is provided in the bending area, and the glass substrate with a relatively large thickness is provided in the non-bending areas. When performing the test, a corresponding result is recorded when one test sample shows a bright spot or the glass substrate breaks.

It should be noted that when performing the impact test, the outer surfaces of the comparative sample 1 and the comparative sample 2 are both adhered to the CPI with a thickness of 80 μm and the OCA with a thickness of 50 um (each of the comparative samples includes the CPI film layer of the ultra-thin glass arranged on the first side of the ultra-thin glass through the OCA and the PET layer arranged on the second side of the ultra-thin glass through the OCA), and test results thereof are also as shown in the following table.

| Item | Pen-down test | | Extrusion test | | Pencil hardness | | Dynamic bending 20 w times |
| --- | --- | --- | --- | --- | --- | --- | --- |
| | Bending area | Non-bending area | Bending area | Non-bending area | Bending area | Non-bending area | |
| First sample | 15 cm | 50 cm | 19 kg | 46 kg | HB | 6H | R2 |
| Second sample | 28 cm | 100 cm | 33 kg | 67 kg | HB | 6H | R3 |
| Third sample | 8 cm | 8 cm | 4 kg | 4 kg | 9H | 9H | R2 |
| Fourth sample | >100 cm | >100 cm | >70 kg | >70 kg | 4H | 4H | R1 |
| Comparative sample 1 | 18 cm | 18 cm | 8 kg | 8 kg | 9H | 9H | R0.5 |
| Comparative sample 2 | 38 cm | 38 cm | 18 kg | 18 kg | 9H | 9H | R2 |

When a pen-down test is performed, a test equipment is a pen of M&G brand, and an evaluation standard is cracking of the ultra-thin glass or the glass substrate (an evaluation standard of the comparative samples is ultra-thin glass cracking, and an evaluation standard of the first sample to the fourth sample is showing bright spots or glass substrate cracking), and a test method is as follows:
  selecting a test point, controlling a pen of M&G brand with a mass of 12 g (a diameter of a tip of the pen is 5 mm), with the tip of the pen facing downwards and falling vertically from a specified height, where the test is started from a height of 0.5 cm, and multiple tests are performed in increments of 0.5 cm; recording a pen-down height of CPI dent and ultra-thin fracture for a test of each comparative sample, and recording a pen-down height showing that a bright spot or glass substrate fracture occurs for test of each of the first sample to the fourth sample;
  inspecting an appearance of the cover plate after pen-down impact is completed and recording test results; and
  selecting different test points, testing by the above steps, and recording the test results.

In the above table, for the first sample, a bright spot appeared when dropped from a height of 15 cm for the test of the bending area, and a bright spot or glass substrate cracking appeared when dropped from a height of 50 cm for the test of the non-bending areas. For comparative sample 1, the tests for the different regions all fell from a height of 18 cm and the ultra-thin glass broke.

When an extrusion test is performed, an evaluation standard for the comparative samples is ultra-thin glass cracking, and an evaluation standard for the first to fourth samples is that an evaluation equipment showed bright spots or glass substrate cracking. The evaluation equipment is an extrusion tester, and a test pressure head is a spherical pressure head with a diameter of 1.2 mm (a material of the pressure head is stainless steel).

In the test, a plurality of test points are selected, for each test point, close the test pressure head to a sample at a speed of 10 mm/min, and after contacting the sample, the sample is pressed with loads of 1 kg, 1.5 kg, 2 kg, and other respectively, each test point is left for 10 seconds, a load at which the ultra-thin glass broke is recorded for a test of each comparative sample, and a load at which the appearance of a bright spot or the glass substrate broke is recorded for a test of each of the first to fourth samples. In the above table, for the first sample, the compression test is performed, and for the bending area, the load corresponding to the appearance of the bright spot is 19 kg, and for the non-bending areas, the load corresponding to the appearance of the bright spot or the breakage of the glass substrate is 46 kg; for comparative sample 1, the ultra-thin glass shattered at 8 kg for all regions.

When a pencil hardness test is performed, an evaluation standard is that a pencil hardness is more than or equal to 7, an evaluation equipment is a pencil hardness tester, and a test method is as follows: before testing, it is necessary to inspect an appearance of product without such defects as discoloration, bubble, crack, and shedding, and the sample surface is wiped clean with a lint-free cloth; the triangular pencil lead is cut into a cylinder with a diameter of 3 mm, the pencil is held so that an end face of the pencil lead is perpendicular to 400 mesh sandpaper at an angle of 90 degrees, and then a circle is slowly drawn until the end face of the pencil lead is flat and the periphery is sharp; the sample to be tested is placed on a horizontal and stable surface, the ground pencil is inserted into the evaluation equipment, a head of the pencil lead is in contact with a test surface of a sample at an angle of 45 degrees, 5 lines are drawn at a pressure of 1 kgf, a speed of 10±2.5 mm/s and a stroke of 30 mm, only one line is allowed to fail (if the test surface is scratched, it is not acceptable). For example, when the pencil hardness is 9H, the pencil hardness of the test sample is more than or equal to 9H if all 5 lines are or one line is fail, if the number of failed lines in the 5 lines drawn is more than or equal to 2, then the pencil hardness of the test sample is less than 9H. The data in the table is the maximum allowable pencil hardness of the test sample.

When a dynamic bending test is performed, an evaluation standard is that a laminated structure shows offset or the glass substrate (ultra-thin glass for the comparative sample) breaks. For example, in the above table, the first sample is dynamically bent 20 W times and the minimum bending radius is 2 mm, and the comparative sample 1 is dynamically bent 20 W times and the minimum bending radius is 0.5 mm.

It can be seen from the above table that by using a combination of different structures, compared with a structured form using only one structure of ultra-thin glass in the related art, the cover plate of the present embodiment has a strong bending performance in the bending area and a strong impact strength in the non-bending areas, thus solving the problem that the bending performance and the impact strength cannot be balanced.

It can be seen from the above table that the corresponding performances of different regions of the cover plate can be achieved by adjusting parameters such as the thickness of the corresponding structure and the material used.

Figure 10:
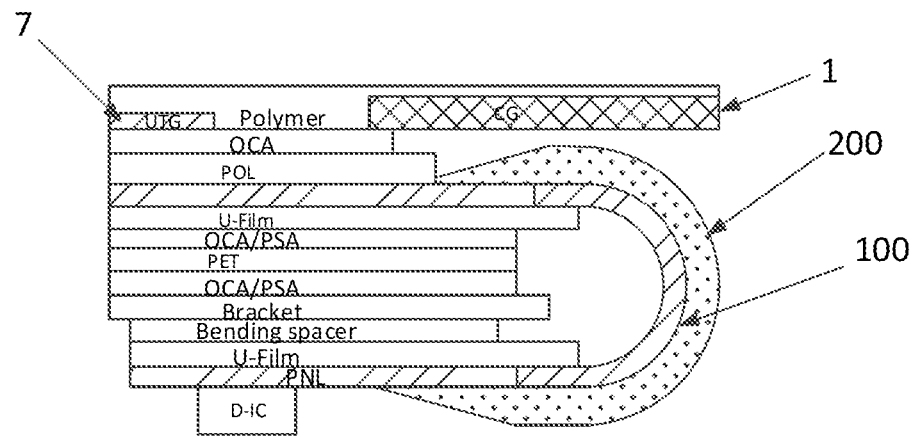
FIG. 10 is a schematic structural diagram 3 of the display module according to an embodiment of the present disclosure.

Referring to FIG. 8-FIG. 10, a display module is further provided in the embodiments of the present disclosure, including a display panel 100 and the above cover plate located on a light-emitting side of the display panel 100.

Illustratively, the display panel 100 includes a binding area, where the binding area is bent to a backlight side of the display panel 100 to be in a binding connection with a main circuit board, and a protective adhesive layer 200 is provided on one side of the binding area close to the cover plate.

An orthographic projection of the binding area on the cover plate may coincide completely with the cover plate, or the orthographic projection of the binding area on the cover plate may be located in a first region of the cover plate, and the cover plate includes an edge region exposed at periphery of the first region.

Figure 16:
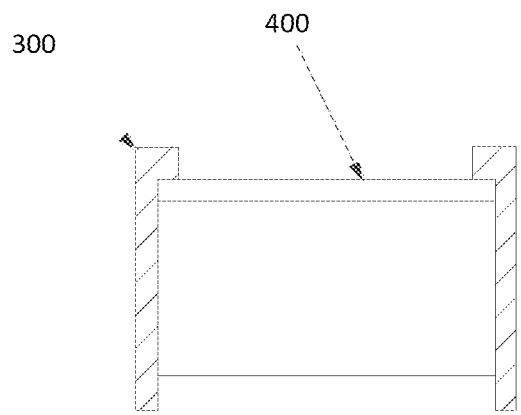
FIG. 16 is a schematic diagram 1 of an assembled state of the cover plate and a center frame according to an embodiment of the present disclosure.

In the folding products of the related art, since the cover plate has a certain flexibility, if the cover plate is flush with or flares out relative to the binding area of the display panel, there is a risk of the cover plate adhering to the MCL adhesive (i.e., the protective adhesive layer 200) after a pad bending process, thereby causing a problem such as display abnormality. Therefore, in the related art, the edge of the cover plate is retracted relative to the edge of the binding area, and although the risk of adhesion between the cover plate and the protective adhesive layer 200 is avoided by such a structure design, on the one hand, the protective adhesive layer 200 and the binding area are exposed to an outer edge, and there is still a risk of impact in subsequent processes such as assembly of the whole machine; on the other hand, when the whole machine is installed, a center frame 300 covers the surface of the cover plate 400 from top to bottom (the center frame 300 covers a part of the cover plate 400), which is equivalent to a case where the screen is integrally recessed in the center frame 300, affecting aesthetics and a screen area ratio, with reference to FIG. 16.

With regard to the above problem, with respect to the cover plate made of the ultra-thin glass, in the present embodiment, the glass substrate 1 which is better in rigidity and stiffness than the ultra-thin glass is used in the non-bending areas 20 (the thickness of the glass substrate 1 is more than or equal to 300 um), and the edge of the cover plate can be flush or suitably flared with respect to the edge of the binding area, i.e., the orthographic projection of the binding area on the cover plate completely coincides with the cover plate, or the orthographic projection of the binding area on the cover plate is located in the first region of the cover plate, and the cover plate includes an edge region exposed at the periphery of the first region. In this way, the support of the cover plate is strong, regardless of the adhesion between the cover plate and the protective adhesive layer 200; and the binding area can be effectively protected from impact in subsequent processes such as whole machine assembly from the front side.

Figure 17:
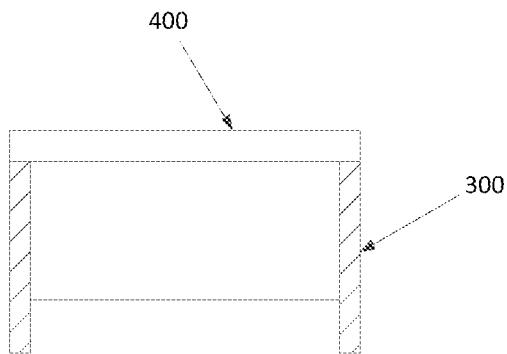
FIG. 17 is a schematic diagram 2 of the assembled state of the cover plate and the center frame according to an embodiment of the present disclosure.

Referring to FIG. 17, illustratively, the cover plate 400 includes an edge region exposed to the periphery of the first region, and the center frame 300 of the display module is coupled to a side of the edge region adjacent to the display panel.

When assembling the center frame, it can be considered that the center frame is internally fastened to the cover plate from the back, i.e., the center frame is integrally located at the backlight side of the cover plate so as to increase the proportion of the whole machine screen.

A display device is further provided in the embodiments of the present disclosure, including the display module described above.

It should be understood that the above embodiments are merely exemplary embodiments that have been employed to illustrate the principles of the present disclosure, and that the disclosure is not limited thereto. It will be apparent to those skilled in the art that various modifications and variations can be made in the present disclosure without departing from the spirit or scope of the disclosure.

What is claimed is:

1. A cover plate, comprising a cover plate body comprising a bending area and non-bending areas located at two sides of the bending area, wherein:
   each of the non-bending areas comprises a glass substrate and the bending area comprises a first optical resin coating layer formed by a coating process using an optical resin material;
   the cover plate body comprises a first side and a second side oppositely arranged in a thickness direction of the cover plate body;
   in a direction from the first side to the second side, each of the non-bending areas comprises the glass substrate and a second optical resin coating layer coated on the glass substrate;
   the first optical resin coating layer comprises a first surface located on the second side, the second optical resin coating layer comprises a second surface located on the second side, and the first surface and the second surface are in the same plane;
   the cover plate body further comprises a transition area between the bending area and each of the non-bending areas, the transition area comprises a third optical resin coating layer, the third optical resin coating layer comprises a fifth surface located on the second side, and the fifth surface and the second surface are in the same plane; and
   the glass substrate comprises the third surface located on the first side, the third optical resin coating layer comprises a sixth surface located on the first side, and the sixth surface and the third surface are in the same plane.

2. The cover plate according to claim 1, wherein the glass substrate comprises a third surface located on the first side, the first optical resin coating layer comprises a fourth surface located on the first side, and the third surface and the fourth surface are in the same plane.

3. The cover plate according to claim 2, wherein the first side of the cover plate body is bonded with a first flexible film material through an optical adhesive layer and/or the second side of the cover plate body is bonded with the first flexible film material through the optical adhesive layer.

4. The cover plate according to claim 3, wherein the first flexible film material is made of polyethylene terephthalate (PET), colorless polyimide (CPI), polymethyl methacrylate (PMMA), or ultra-thin glass.

5. The cover plate according to claim 4, wherein a thickness of the first flexible film material is less than or equal to 20 μm.

6. The cover plate according to claim 1, wherein in the direction from the first side to the second side, the bending area comprises a second flexible film material and the first optical resin coating layer coated on the second flexible film material.

7. The cover plate according to claim 1, wherein the first side of the cover plate body is bonded with a third flexible film material through the optical adhesive layer or the second side of the cover plate body is bonded with the third flexible film material through the optical adhesive layer.

8. The cover plate according to claim 1, wherein the glass substrate comprises a side surface arranged close to the bending area, and a light incident surface and a light emitting surface adjacent to the side surface, the light incident surface is configured for receiving the light emitted by a display panel; and
   an edge where the light emitting surface meets the side surface is chamfered or rounded and/or an edge where the light incident surface meets the side surface is chamfered or rounded.

9. The cover plate according to claim 8, wherein a cross section of one end of the glass substrate close to the bending area in the thickness direction of the cover plate body is ½ ellipse, or the cross section of one end of the glass substrate close to the bending area in the thickness direction of the cover plate body is ¼ ellipse, and the ¼ ellipse protrudes toward a direction away from the light incident surface.

10. The cover plate according to claim 8, wherein in a direction from each of the non-bending areas to the bending area, the light emitting surface of the glass substrate comprises a plane portion, a slope portion, and an arc portion, and the arc portion is formed by rounding at an intersection of the light emitting surface and the side surface; and/or in the direction from each of the non-bending areas to the bending area, the light incident surface of the glass substrate comprises the plane portion, the slope portion, and the arc portion, and the arc portion is formed by rounding at an intersection of the light incident surface and the side surface.

11. The cover plate according to claim 1, wherein the first optical resin coating layer, the second optical resin coating layer, and the third optical resin coating layer are made of the same material, and a difference between a refractive index of the first optical resin coating layer and a refractive index of the glass substrate is less than or equal to 0.01.

12. The cover plate according to claim 11, wherein the refractive index of the first optical resin coating layer is n, and $1.50 \leq n \leq 1.54$.

13. The cover plate according to claim 11, wherein a transmission of the first optical resin coating layer is more than or equal to 90%.

14. The cover plate according to claim 11, wherein the material of the first optical resin coating layer is one or more of polyester, polyurethane, thermoplastic polyurethane, polyamide, polyimide, polymethyl methacrylate, polypropylene, polyethylene, polypropylene, polyvinyl chloride, polystyrene, styrene, polyoxymethylene, polyphenylene oxide, polyphenylene sulfide, polysulfone, polyaryletherketone, styrene, polyolefin and polyolefin.

15. A display module, comprising a display panel and a cover plate located on a light-emitting side of the display panel, the cover plate comprises a cover plate body comprising a bending area and non-bending areas located at two sides of the bending area, wherein:
   each of the non-bending areas comprises a glass substrate and the bending area comprises a first optical resin coating layer formed by a coating process using an optical resin material;
   the cover plate body comprises a first side and a second side oppositely arranged in a thickness direction of the cover plate body;
   in a direction from the first side to the second side, each of the non-bending areas comprises the glass substrate and a second optical resin coating layer coated on the glass substrate;

the first optical resin coating layer comprises a first surface located on the second side, the second optical resin coating layer comprises a second surface located on the second side, and the first surface and the second surface are in the same plane;

the cover plate body further comprises a transition area between the bending area and each of the non-bending areas, the transition area comprises a third optical resin coating layer, the third optical resin coating layer comprises a fifth surface located on the second side, and the fifth surface and the second surface are in the same plane; and the glass substrate comprises the third surface located on the first side, the third optical resin coating layer comprises a sixth surface located on the first side, and the sixth surface and the third surface are in the same plane.

16. The display module according to claim 15, wherein the display panel comprises a binding area, wherein the binding area is bent to a backlight side of the display panel to be in a binding connection with a main circuit board, and a protective adhesive layer is provided on one side of the binding area close to the cover plate; and an orthographic projection of the binding area on the cover plate is coincided completely with the cover plate, or the orthographic projection of the binding area on the cover plate is located in a first region of the cover plate, and the cover plate comprises an edge region exposed at periphery of the first region.

17. The display module according to claim 16, wherein the cover plate comprises the edge region exposed at the periphery of the first region, and a center frame of the display module is connected to a side of the edge region close to the display panel.

18. A display device, comprising a display module, the display module comprises a display panel and a cover plate located on a light-emitting side of the display panel, the cover plate comprises a cover plate body comprising a bending area and non-bending areas located at two sides of the bending area, wherein:

each of the non-bending areas comprises a glass substrate and the bending area comprises a first optical resin coating layer formed by a coating process using an optical resin material;

the cover plate body comprises a first side and a second side oppositely arranged in a thickness direction of the cover plate body;

in a direction from the first side to the second side, each of the non-bending areas comprises the glass substrate and a second optical resin coating layer coated on the glass substrate;

the first optical resin coating layer comprises a first surface located on the second side, the second optical resin coating layer comprises a second surface located on the second side, and the first surface and the second surface are in the same plane;

wherein the cover plate body further comprises a transition area between the bending area and each of the non-bending areas, the transition area comprises a third optical resin coating layer, the third optical resin coating layer comprises a fifth surface located on the second side, and the fifth surface and the second surface are in the same plane; and the glass substrate comprises the third surface located on the first side, the third optical resin coating layer comprises a sixth surface located on the first side, and the sixth surface and the third surface are in the same plane.

* * * * *